United States Patent [19]

Suciu

[11] 4,245,199
[45] Jan. 13, 1981

[54] SEMICONDUCTOR CCD TRANSVERSAL FILTER WITH CONTROLLABLE THRESHOLD LEVEL

[75] Inventor: Paul I. Suciu, Chatham Township, Morris County, N.J.

[73] Assignee: Bell Telephone Laboratories, Incorporated, Murray Hill, N.J.

[21] Appl. No.: 904,790

[22] Filed: May 11, 1978

[51] Int. Cl.³ .................... H03H 15/02; H03K 5/135; G11C 19/28

[52] U.S. Cl. .............................. 333/165; 307/221 D; 333/166; 357/24

[58] Field of Search .................. 333/165, 166; 357/24; 328/167; 307/221 D, 221 C

[56] References Cited

U.S. PATENT DOCUMENTS

| | | | |
|---|---|---|---|
| 4,032,867 | 6/1977 | Engeler et al. | 333/165 |
| 4,075,514 | 2/1978 | Sequin | 307/221 D X |
| 4,126,836 | 11/1978 | Carnes et al. | 333/165 |
| 4,139,783 | 2/1979 | Engeler | 357/24 X |

OTHER PUBLICATIONS

Baertsch et al., "The Design and Operation of Practical Charge-Transfer Transversal Filters", in IEEE Trans. on Electron Devices, vol. ED-23, No. 2, Feb. 1976, pp. 133-141.

Ibraham et al., "Multiple Filter Characteristics Using a Single CCD Structure", 1975, International Conference on the Application of Charge-Coupled Devices, Oct. 1975, pp. 245-249.

Primary Examiner—Marvin L. Nussbaum
Attorney, Agent, or Firm—David I. Caplan

[57] ABSTRACT

A filter in the form of a semiconductor charge coupled device (CCD) split electrode transveral filter section (10) of many transfer stages, typically of the order of 150, is characterized by a controllable detection threshold level by means of the addition of an auxiliary CCD split-electrode section (20) of but a few stages, typically one or two. Each segment of a split-electrode 209 of this auxiliary section (20) is connected to the corresponding sense line of the transveral filter section (10).

10 Claims, 7 Drawing Figures

SEMICONDUCTOR CCD TRANSVERSAL FILTER WITH CONTROLLABLE THRESHOLD LEVEL

BACKGROUND OF THE INVENTION

1. Field of the Invention

This invention relates to the field of semiconductor apparatus, and more particularly to semiconductor charge coupled devices having a split-electrode transversal filter configuration.

Semiconductor charge transfer devices generally are of two basic types: charge coupled devices (CCD) and bucket brigade devices (BBD). Either of these types, preferably the CCD, can be used for transfer of signal charge packets along a semiconductor signal charge transfer channel and can be built in the form of a transversal filter device, that is, a tapped delay line configuration with suitably weighted outputs. Such a filter device contains many stages, typically of the order of ten or more, each stage containing a split-electrode having two electrode segments, of equal widths but different lengths, for sensing the signal charge packet instantaneously in that stage of the channel. Typically, the effective charge sensing lengths ($l_1$ and $l_2$) of the two segments of such a split-electrode pair in a given stage are characterized by a ratio, $r = l_1/l_2$, in accordance with a predetermined tap weight for that stage; whereas the sum of the lengths ($l_1 + l_2$) of the two segments of a split-electrode pair is the same for all such split-electrode pairs, corresponding to the width of the underlying semiconductor signal charge transfer channel. The effective tap weight $r_i$ of that stage is then given by: $r_i = (l_1 - l_2)/(l_1 + l_2)$. One electrode segment ($l_1$) of every split-electrode is conductively coupled to a first common output terminal for the charge transfer device, and the other electrode segment ($l_2$) of every split-electrode is conductively coupled to a second common output terminal for the charge transfer device. For convenience of description, all the electrode segments that are connected to the first common output terminal are referred to as forming the "first set" of sense electrodes, and all the electrode segments that are connected to the second common output terminal are referred to as forming the "second set" of sense electrodes.

During operation of such a charge transfer device of the split-electrode type, there will be a sequence of periodic time intervals (or time slots) during which everyone of these split-electrode segments is sensitive to the corresponding underlying signal charge packet in the semiconductor signal charge transfer channel by reason of induced electrical image charges, so that signals ($S_1$ and $S_2$) are periodically developed at the output terminals respectively of the first and second set of electrodes, each such signal being proportional to the sum of the various charge packets underlying all the various electrodes in that set, with each such packet multiplied by the corresponding tap weight. The desired output signal of the device is then the sequence of instantaneous differences between the signals periodically developed during the aforementioned time slots at the two output terminals; that is, the desired (difference mode) output signal ($S_1 - S_2$) for a given time slot is proportional to:

$$\Sigma Q_i(1+r_i)/2 - \Sigma Q_i(1-r_i)/2 = \Sigma Q_i r_i \tag{1}$$

where $r_i$ is the effective tap weight of the split-electrode pair of the i'th stage, and $Q_i$ is the charge packet in the i'th stage during the given time slot.

In the use of such a CCD transversal filter as a bandpass device, such as a tone detector, it is desirable to have a threshold level of detection such that if, and only if, the input signal contains significant components in the frequency range of interest will there be any output from the filter. Likewise, in the cases of lowpass and highpass filters, a similar threshold level is desirable. In many applications of filters, it is also desirable that this threshold level be insensitive to variations in processing parameters, as well as voltage and temperature fluctuations. Also, it is often desirable to be able to control (change or "shift") the threshold level by external means. Although such threshold level shifting can obviously be achieved by known techniques for varying the threshold level of amplifier detectors of the output of the CCD filter; nevertheless, such an approach suffers from the problem that the resulting threshold level is not stable with respect to fluctuations in the gain of the CCD transversal filter channel caused by fluctuations in such parameters as the oxide thickness and electrode width.

In U.S. Pat. No. 4,032,867, issued to Engeler et al on June 28, 1977, a split-electrode CCD low-pass transversal filter is disclosed in which an added auxiliary charge transfer channel propagates a constant preselected balancing charge. The auxiliary channel runs along the entire length of filter parallel to the signal charge transfer channel underneath extensions of every sense electrode of the second set, the size of these extensions being selected such that the sum of the effective areas (and hence capacitances) of the first set of sense electrodes is equal to the sum of the effective areas of the second set of sense electrodes plus the extensions thereof. Thereby, the filter is electrically "balanced", that is, the output voltage difference between the first set and the second set of sense electrodes is equal to zero ("quiescent point") when the input to the signal channel is at a predetermined fixed (D.C.) level, depending upon the magnitude of the preselected balancing charge. Although this approach for obtaining threshold detection levels might be generalized to encompass the case of bandpass filters; nevertheless, in operation, unless radically different charge densities are used in the auxiliary charge transfer channel from those in the signal charge transfer channel, the required auxiliary channel width becomes inordinately small for the case of a bandpass filter whose number N of sense electrodes is over a hundred. For example, in the case of N = 150, the use of equal charge densities in the auxiliary and signal channels causes the required auxiliary channel width to be less than two micron for a threshold level of 20 dB below the maximum CCD signal, that is, below the minimum geometry of about four microns in present-day technology. On the other hand, the use of radically different charge densities in the auxiliary channel from those in the signal channel ("nonmatched" operation) would result in undesirable level shifting caused by uncorrelated fluctuations of temperatures and control voltages in the auxiliary channel vs. the signal channel. Therefore, it would be desirable to have a controllable threshold level for signal detection in a CCD filter which mitigates these problems.

SUMMARY OF THE INVENTION

In a CCD transversal filter ("main CCD") of N stages having a split-electrode configuration, control over the threshold detection level is obtained by the use of an auxiliary charge transfer channel of n stages, where N is at least an order of magnitude larger than n, and where n is typically equal to only 1 or 2. Typically, the channel width W of the auxiliary transfer channel is the same as that of the main CCD; and the auxiliary channel is positioned in line with the main channel. Overlying this auxiliary channel is a split-electrode each of whose segments is connected to the common output terminal of a different set of the sense electrodes of the main CCD. During operation, the auxiliary channel propagates control packets of equal preselected charge contents depending upon the desired amount of threshold level shift. Thereby, a detection level for signals passed by the filter is established which depends upon the preselected charge content $Q_A$ of the packets propagated through the auxiliary channel and the tap weight $r_A$ of the split-electrode of the auxiliary channel. This result can be seen from the fact that it follows from equation (1) that the output signal becomes:

$$\Sigma Q_i r_i + Q_A(1+r_A)/2 - Q_A(1-r_A)/2 = (\Sigma Q_i r_i) + Q_A r_A \quad (2)$$

where $r_A$, the tap weight of the auxiliary split-electrode is preferably negative, i.e., its $l_1$ is less than its $l_2$. In this way, the resulting difference mode output level of the filter is shifted by a fixed amount. As indicated in FIG. 1, when this output is sensed by a flip-flop, or other binary digital level detector, whose output is sampled at a fixed rate, s, only if the input 3 into the filter (and hence output samples 21, 22, 23, etc., out of the filter) is of frequency within the band of the filter and has sufficient amplitude to change the sign of the above-expression (2), that is, only if the input 3 is at times greater than the threshold detection level 2, will there be an output of the detector in the form of sequences of both "1"s and "0"s having a period P equal to the reciprocal frequency of the input. Otherwise, the output will be in the form of a sequence only of "0"s. Accordingly, any noise level that is below the level established by $Q_A r_A$ will not be sufficient to produce this alternating sequence of 1's and 0's, but will produce a sequence of only 0's. Thus, the filter is characterized by threshold detection where the threshold level ($Q_A r_A$) is controllable, that is, can be set at any desired level determined by the product of the auxiliary charge packet content $Q_A$ and the auxiliary tap weight $r_A$. Moreover, by making the electrode widths in the auxiliary CCD equal to those in the main CCD, and by making the auxiliary and main channel widths equal, this threshold level becomes relatively insensitive to fluctuations in processing, temperature, and voltage supplies. In addition, it is important that the capacitance (including the parasitics) of the first group of sense electrodes (the A segments) be equal to that of the second group (the B segments); hence, it is desirable that there be spatial symmetry with respect to the center of the channel of sense electrode metallization connections to the sense lines.

Accordingly, this invention involves semiconductor apparatus comprising a semiconductor charge coupled device having at least one array of split-electrodes, each split-electrode spanning across an underlying signal charge transfer channel of width W in a semiconductor medium arranged for transfer of signal charge packets in a first transfer direction along said channel, and each split-electrode having a first segment connected to a first common output terminal and a second segment connected to a second common output terminal, thereby forming a first CCD section, characterized in that said device includes an auxiliary CCD section containing an auxiliary charge transfer channel in said medium arranged for transfer of predetermined auxiliary charge packets all of equal charge content in a second transfer direction (which may be the same as or opposite to the first direction), at least one auxiliary split-electrode spanning the said auxiliary transfer channel and having first and second segments connected, respectively, to the said first and second common output terminals, thereby forming a second CCD section, the number N of transfer stages in the array being at least an order of magnitude larger than the number n of transfer stages in the auxiliary section, whereby the threshold level for signal detection by the first section is controlled by the second section.

In a specific embodiment of the invention, a CCD transversal filter has a main signal channel which transfers signal charge originating from an input diode (impurity diffusion) to an output diode. Overlying the channel are electrodes for transferring the signal charge packets and split-electrodes for sensing these charge packets. The arrangement of transfer and sense electrodes is similar to that disclosed in U.S. Pat. No. 4,075,514 issued to C. H. Sequin on Feb. 21, 1978. An auxiliary single stage CCD channel, containing a single split-electrode having first and second segments, transfers auxiliary charge packets of fixed charge content originating from an auxiliary input diode to the same output diode as the main signal channel, advantageously in the opposite transfer direction from that of the main CCD channel, so that the main channel and the auxiliary channel can be located on opposite sides of the output diode. The lengths $l_1$ and $l_2$ of the first and second segments (A and B) of each auxiliary sense electrode pair add up to the same lengths ($l_1+l_2$) of the main channel sense electrodes. These first and second segments of the auxiliary channel are connected, respectively, to the first and second common output terminals of the main CCD for sensing by a sampled zero crossing detector, for example, an amplifier feeding a flip-flop.

In another specific embodiment (FIGS. 6 and 7), a main CCD split-electrode transversal filter has three bandpass filters built in one channel, formed by dividing the sense electrodes into three groups, $G_1$, $G_2$, $G_3$, where $G_1$ is composed of sense electrodes numbered $(3i-2)$, $i=1, 2, 3 \ldots N$; $G_2$ is composed of sense electrodes $(3i-1)$; and $G_3$ is composed of sense electrodes $3i$, and connecting together the split-electrode pairs in each group to a separate pair of common output terminals for sensing by a different zero crossing detector. This type of technique of multiple filtering has been described in the 1975 *Proceedings of the International Conference on the Application of Charge-Coupled Devices*, in a paper (pages 245–249) by A. A. Ibrahim et al entitled "Multiple Filter Characteristics Using A Single CCD Structure". An auxiliary charge transfer channel contains six stages, each pair of two stages having sense electrode pairs connected to a different pair of the output terminals corresponding to the three groups $G_1$, $G_2$, $G_3$ of sense electrodes in the main channel. By suitable (differing) choices of the three tap weights of the auxiliary split-electrodes, suitable (differing) threshold levels can be established for the three filters.

BRIEF DESCRIPTION OF THE DRAWING

This invention, together with its features, advantages, objects, and characteristics, may be better understood from the following detailed description when read in conjunction with the drawing in which.

DETAILED DESCRIPTION

Figure 1:
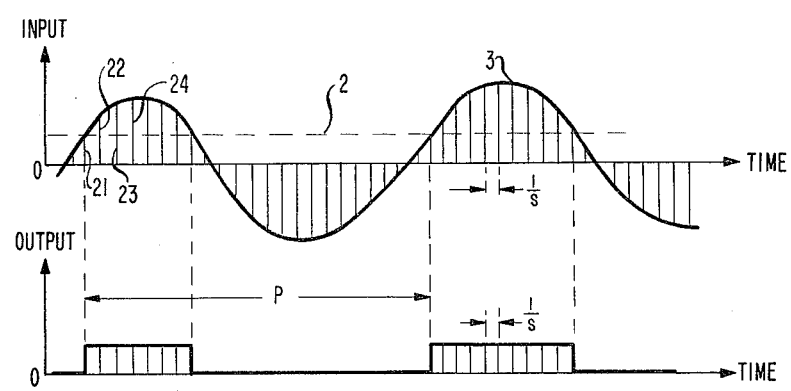
FIG. 1 illustrates the output of a CCD filter apparatus in accordance with this invention.

Referring to FIG. 1, a typical input information bearing signal to a typical CCD bandpass filter has a profile 3, that is, an approximate sinusoidal A.C. characteristic having a significant frequency component $f=1/P$ in the passband of the filter. The output of this CCD filter in the prior art typically is in the form of samples $Q_{iTi}$ whose amplitude varies with time (because the charge packets $Q_i$ vary with time). The sampling rate $1/s$ is the clock frequency of the CCD. Thus, when smoothed out, the output of the prior art is in the form of the input, that is, the sinusoidal curve 3 of frequency f.

In accordance with this invention, however, the desired output threshold level 2 is that level above which the desired output of the CCD filter should be a "1" and below which the output should be a "0", as indicated in the lower portion of FIG. 1. To accomplish this, it is necessary to impose a threshold level of detection. This is indicated in the apparatus shown in FIG. 2.

Figure 2:
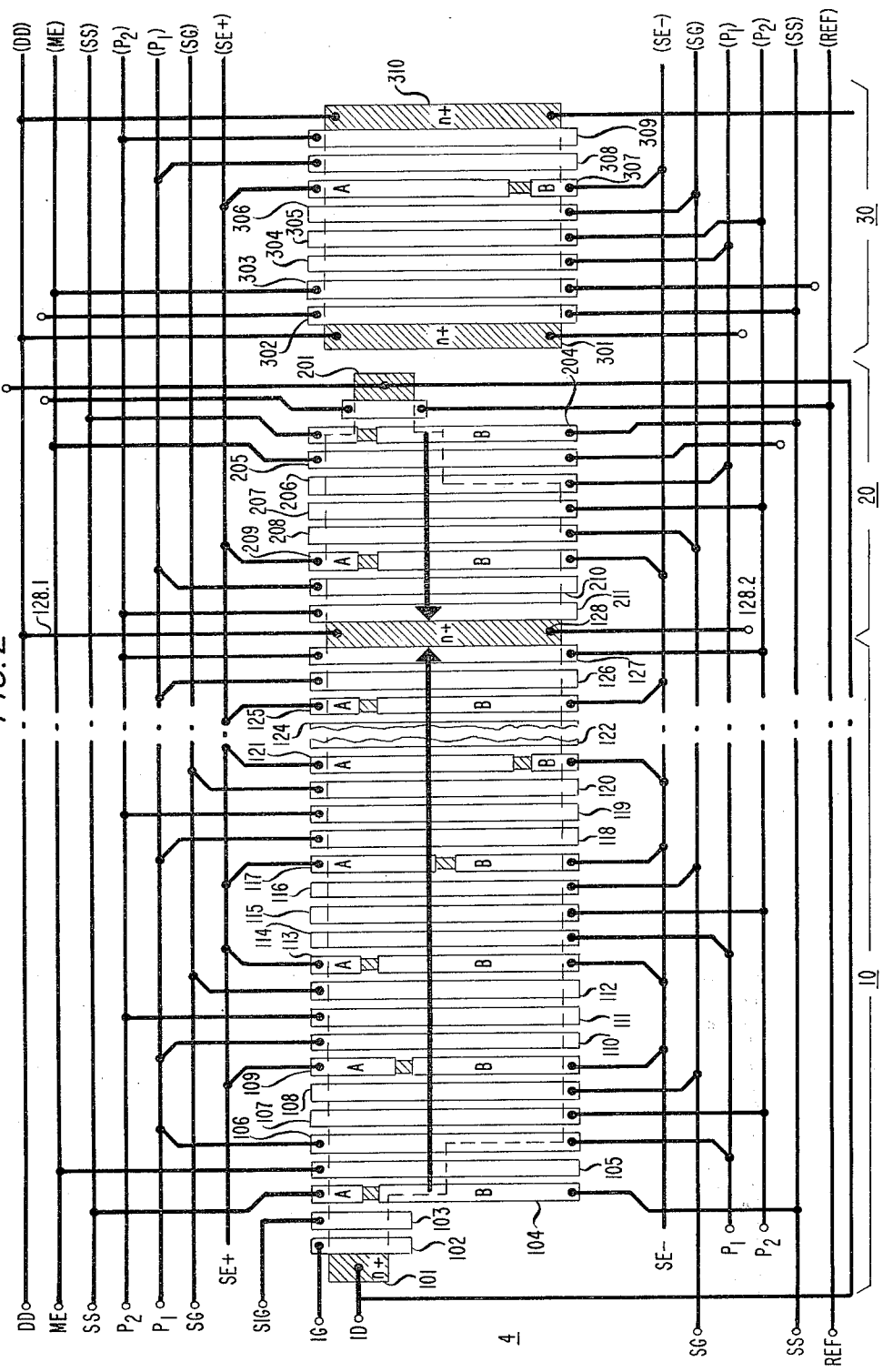
FIG. 2 is a top view diagram of a CCD split-electrode filter apparatus with controllable output threshold level, in accordance with a specific embodiment of the invention.

As shown in FIG. 2, a semiconductor CCD contains a main CCD section 10, an auxiliary CCD section 20, and an added "dummy" CCD section 30. By "dummy" CCD is meant a section which transfers no charge during operation.

The main section contains split-electrodes with gaps between the various splits tailored for bandpass filtering, as known in the art and as described in greater detail below. Charge packets in the main section 10 are transferred during operation in accordance with an input signal to be filtered, from an input diode n+ region 101 (N-MOS technology) to an output diode n+ region 127. At the same time, charge packets of constant size are transferred from an auxiliary input diode n+ region 201 to the same output diode 127; but no charge transfer occurs in the added "dummy" section 30.

Each diode region is formed at the surface of a body of p-type conductivity single crystal silicon (N-MOS technology), typically by impurity diffusion as known in the art. An overlying thin silicon dioxide layer of the order of 1000 Angstrom thick, with contours indicated by the dotted line 11, is located on the top major surface of the body to define an underlying channel in the semiconductor for enabling the transfer of charge packets in accordance with known CCD principles. The portion of the top surface of the semiconductor not within this channel is coated with a relatively thick oxide of the order of 10,000 Angstroms in thickness. Correspondingly, underlying this thick oxide is a p+ (strongly p-type) surface region to function as an added barrier against the channel ("channel stopper") in addition to the channel stop effect of the thick oxide, as known in the art.

Figure 5:
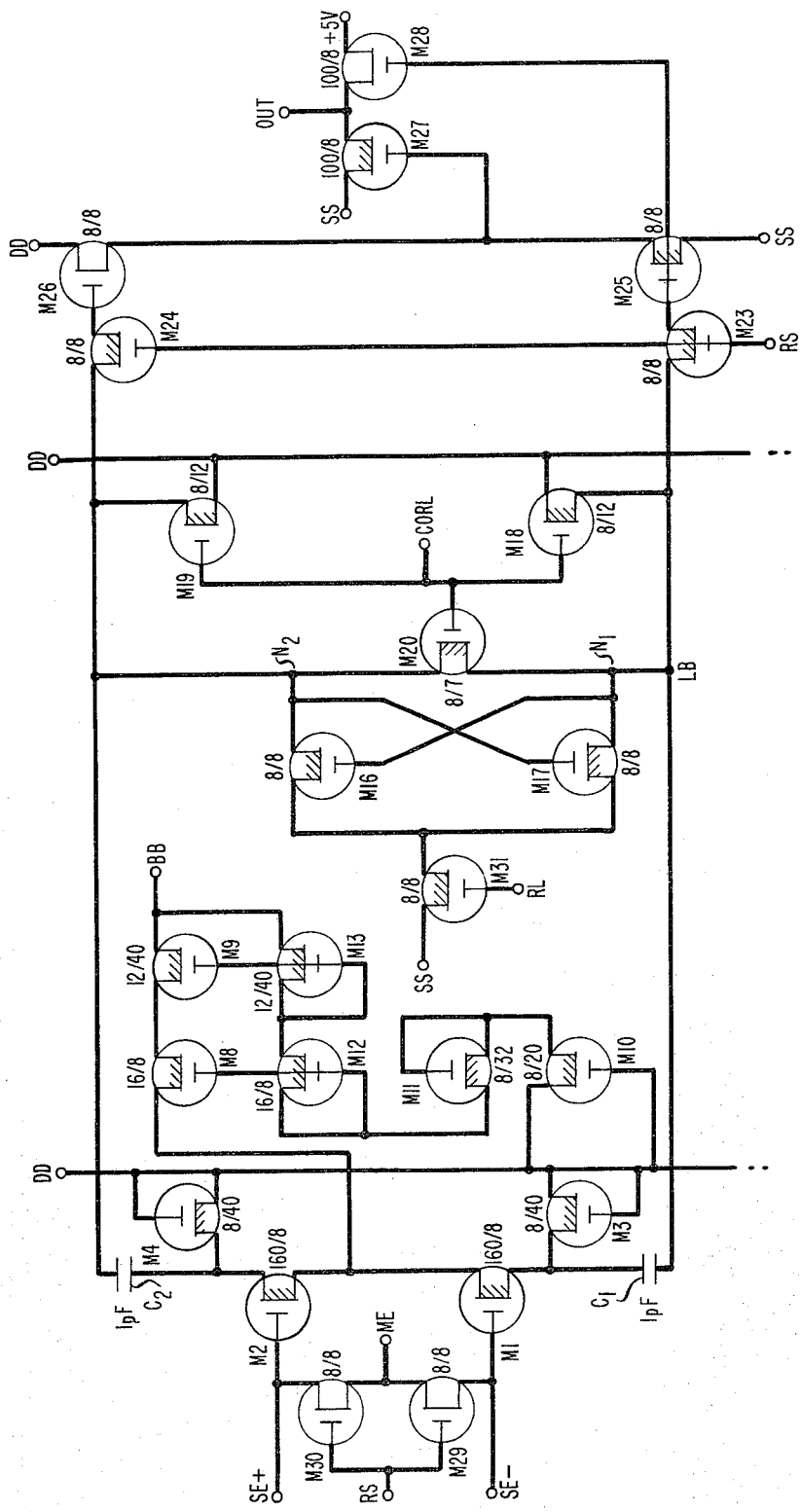
FIG. 5 is a circuit diagram of amplifying output detection circuitry useful in conjunction with the apparatus shown in FIG. 2.

Polysilicon electrodes 102, 103 . . . , 126, in overlapping next-neighbor relationship, overlie the main CCD section 10; while electrodes 203, 204, . . . 211 similarly overlie the auxiliary CCD section 20. These electrodes span the entire width W of the channel, except in those areas where the channel is of lesser width. In general, there are four electrodes in each stage of the CCD, as for example: a $P_1$ clock phase electrode 106, a $P_2$ clock phase electrode 107, a shield gate (SG) electrode 108, and a split-electrode 109 having first and second sense electrode ($SE_+$, $SE_-$) segments A and B, respectively. Advantageously, the $P_1$, $P_2$, and shield gate electrodes in alternate stages of the CCD are connected to opposite input lines which provide suitable voltages for these electrodes, in order to afford a compact structure. Even-numbered electrodes (102, 104 . . . 204, 206, . . . 302, 304 . . . ) are on the "first" level of polysilicon "metallization" and odd-numbered electrodes (103, 105 . . . 203, 205 . . . 303, 305 . . . ) are on the "second" level of polysilicon "metallization". In addition, FIG. 2 shows localized n+ impurity diffused surface regions 101, 201, 301, and 310 at the top surface of the semiconductor, as well as localized n+ regions underlying the gaps between the segments A and B of each split-electrode pair, 104, 109, 113, 117, . . . 209, 307; all such n+ surface regions are indicated by the shaded areas in the drawing. In addition, p+ barrier regions adjacent these localized n+ regions underlying these gaps may be added (not shown) as described in the copending patent application of M. F. Tompsett 12, Ser. No. 818,411, filed in the United States on July 25, 1977, and now U.S. Pat. No. 4,126,794, and having a common assignee herewith. Also, the following "third" level metallization lines are connected to D.C. voltage sources as follows:

SS=0.0 volts
DD=12.0 volts
ME=6.8 volts
SG=1.6 volts
REF=4.2 volts
BB=−5.0 volts (FIG. 5)

The metallization lines for the clock phases $P_1$ and $P_2$ are polysilicon electrodes of the second and first metallization levels, respectively, for supplying the first and second clock pulse phase voltages, respectively. Typically, the voltage applied to line $P_1$ is 8.3 volts during the active phase and 0 volts during the passive phase; whereas the voltage applied to line $P_2$ is 12 volts during the active phase and 0 volts during the passive phase. The input diode line ID is connected to the input diode n+ region 101; the input signal line SIG is connected to electrode 103; and the pair of lines $SE_+$ and $SE_-$ represent the sense electrodes ("rails") for detection of charge underlying the "A" and "B" segments, respectively, of these sense electrodes, in order to detect the combined output of the device sections 10, 20, and 30.

Typically, the polysilicon electrodes have a width of about ten micron; the channel width W is about 256 micron; the gaps between sense electrodes of a given pair are about six micron; and the oxide thickness separating the first level polysilicon from the surface of the semiconductor is about 900 Angstrom.

Figure 3:
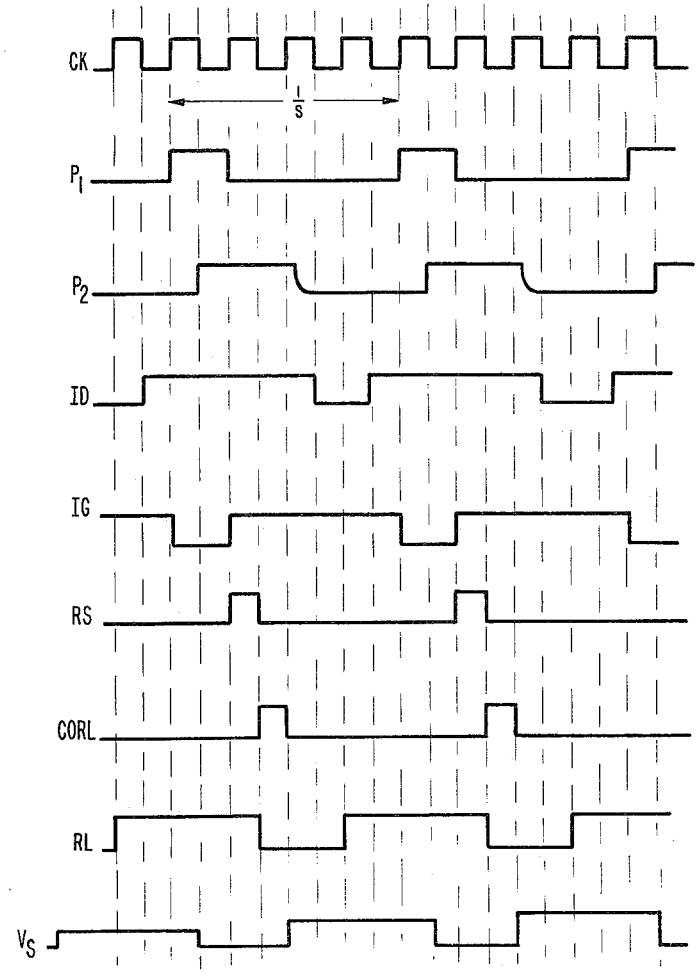
FIG. 3 illustrates the various applied pulsed voltages useful for operation of the apparatus shown in FIG. 2.

FIG. 3 indicates the timing of the various pulsed voltages applied to the various metallization lines in FIGS. 2, 4, 5, 6 and 7. Electrical contact between third-level metallization lines and the polysilicon extensions of the polysilicon electrodes is established by contact holes in the oxide. On the other hand, the polysilicon extensions of some of the electrodes are not connected to any third-level metallization, as indicated by the small open circles at the extremity of the polysilicon extension, as for example the lower extension of electrode 310. These nonconnected electrode extensions are useful for equalizing parasitic capacitance (overlap) produced by the crossunders of other extensions of electrodes with respect to the sense electrode lines $SE_{30}$ and $SE_-$. It should be understood that, although each of the extensions of the polysilicon electrodes is indicated in FIG. 2 by a single line, this representation is solely for the purpose of clarity in the drawing; but, in reality, each of these extensions is of approximately the same width as the main portion of the polysilicon electrode.

The main device section 20 contains typically about $N = 150$ spatial periods of electrodes, each such period being defined by four consecutive electrodes; whereas the device sections 20 and 30 advantageously contain typically only the limited number n of electrode periods explicitly shown in FIG. 2.

The relative sizes of the A and B segments of each split-electrode pair in the main CCD section 10 are designed in accordance with the desired filter characteristic, as known in the art. On the other hand, the difference in lengths of the A and B segments of the electrode 208 in the auxiliary CCD section 20 determines the threshold level 2 (FIG. 1). In addition, the threshold level can be made different by use of a different charge packet content injected into the auxiliary section by the n+ region 201, as by connecting the metering ME electrode 205 to a different voltage source. Advantageously, the ratio of the lengths of the A to B segments of the split-electrode 307 in the "dummy" CCD section 30 is the inverse of the ratio of the A to B segments of the split-electrode 209 in the auxiliary CCD section 20, that is, the split in the sense electrode of the added "dummy" CCD 30 section is located in a complementary relationship to the split of the sense electrode in the auxiliary CCD section 20, i.e., having equal but opposite tap weight.

At the beginning of the main section 10, at the extreme left-hand edge, the channel is advantageously less than one-half (W/2) as wide as in the bulk of the device, typically about W/10 to W/4; this channel widens to the half-size W/2 under the electrode 104 and to the full size W under the electrode 106. At the extreme right-hand edge of the auxiliary section 20, the width of the channel 11 is only W/4; the channel widens to W/2 under the electrode 204 and to full size W under the electrode 206. The purpose of the narrower width W/2 is for ensuring that excessive charges are not generated in the device. In any event, however, every sense electrode pair connected to the sense lines overlies a region of the channel of full width W.

The overall operation of the device sections 10, 20, and 30 involves the transfer of charge packets in accordance with signal from left to right in the "main" section 10, the transfer of charge packets in accordance with the desired output threshold level from right to left in the auxiliary section 20, and no transfer of packets in the "dummy" section 30, as more fully described below. The purpose of this extra section 30 is to provide equalization of the capacitances of the sense electrode lines $SE_+$ and $SE_-$ with respect to the underlying silicon body, which is otherwise unbalanced by the presence of the split-electrode 209 in the auxiliary section 20. Thus, the location of the gap in the split-electrode 307 in the extra section 30 relative to that of the gap in the split-electrode 209 in the auxiliary section 20 is advantageously complementary, that is, equidistant from, but on opposite sides of, the center line of the channel. On the other hand, the location of the gap between the split-electrodes A and B of the pair 208 in the auxiliary section 20 is selected to achieve the desired threshold level. In mathematical terms, the threshold detection level 2 (FIG. 1) is proportional to $Q_A r_A$, where $Q_A$ is the (constant) charge packet content of each packet in the auxiliary section 20 and $r_A$ is the tap weight of the split-electrode 209, as indicated above in equation (2).

FIG. 3 shows the magnitude and timing of the various voltage sources, using the following abbreviations:
CK = master clock
$P_1$ = clock pulse phase 1
$P_2$ = clock pulse phase 2
ID = Input Diode
IG = Input Gate
RS = ReSet
CORL = Correlation
RL = Reset Latch It should be obvious, however, that other arrangements of the input gate and clock phase voltage can be used, as known in the art to generate and propagate charge packets in a CCD.

Figure 4:
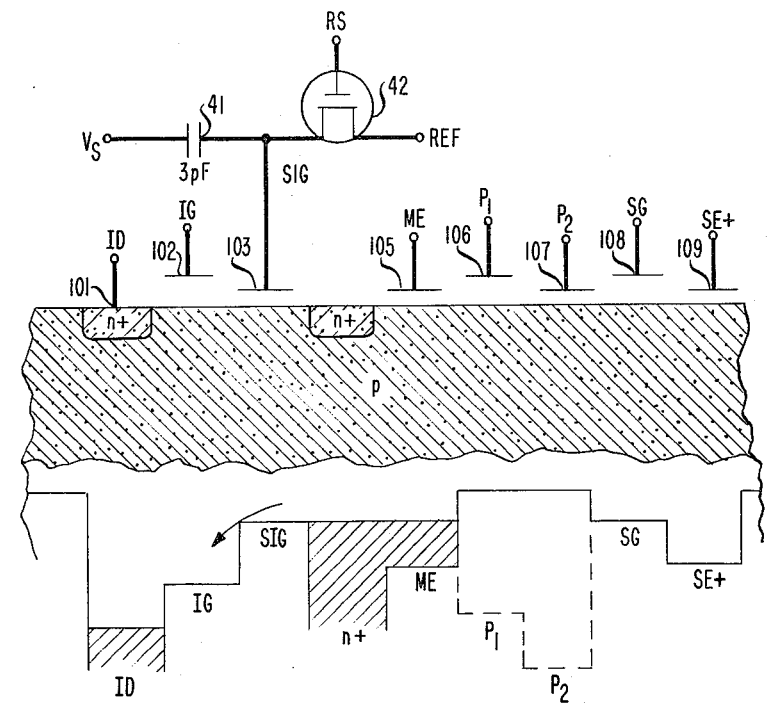
FIG. 4 is a diagram of input charge injection circuitry useful in conjunction with the apparatus shown in FIG. 2.

FIG. 4 illustrates symbolically the input end of the main CCD section 10, and further illustrate a presently preferred mode of impressing the signal input voltage $V_S$ upon the charge packets, in such a manner as to minimize pickup noise. Accordingly, the input signal voltage $V_S$, which is of a return to "zero" type (e.g., a dc level of 5 volt in this specific embodiment), typically between 3 and 7 volts, is fed through a blocking capacitor 41 (FIG. 4), typically 3 pF, to the SIG electrode 103 only during intervals when a reset switch 42 is open by reason of reset voltage RS. The n+ diffusion region 43 located between the SIG electrode 103 and the ME electrode 105, and between the A and B segments of electrode 104 (both maintained at constant voltage SS), enables the SIG and ME electrodes to be located on the same polysilicon level, thereby mitigating the problem otherwise arising from the threshold difference in the semiconductor underneath electrodes of differing polysilicon levels.

During operation, the input diode n+ region 101 is pulsed to a voltage of about 0.3 volts (from its other voltage level of about 9 volts) at a time when $P_1$ and $P_2$ are in their own "passive" phases of 0.0 volts applied. Accordingly, the semiconductor surface regions underneath electrodes 102, 103, 104 and 105 are filled with charges (electrons) to a level of 0.3 volts (so long as the signal voltage on electrode 103 is kept in a range that makes the underlying surface potential greater than 0.3 V). After termination of the pulse on the input diode region 101, charges spill back to this region until the charge level under ME electrode 105 falls to a corresponding surface potential equal to that underlying the SIG electrode 103. The SIG electrode, which was initially charged by RS to the REF voltage, is then at a voltage potential determined by the signal $V_S$ capacitively coupled to this electrode. Thus, the dc level of the signal $V_S$ has no influence on the "dc" level of the charge in the ME surface potential well as determined by the REF voltage. A half masterclock interval thereafter, the $P_1$ electrode 106 goes to a potential of the "active" phase of about 8.3 volts (indicated by the dotted lines at the bottom of FIG. 4), thereby drawing into its underlying surface region the charge previously underneath the ME electrode 105. It should be remembered that the channel width in the area of this ME electrode is only one-half as much as in the area of the $P_1$ electrode 106, to prevent overfilling thereof. Thus, the charge transferred to the surface region underneath this $P_1$ electrode is ultimately determined by the signal voltage $V_S$ applied to the SIG electrode 103 through the capacitor 41. Thereafter, this signal dependent charge is transferred through the main CCD section 10 in accordance with conventional CCD principles.

FIG. 5 is a circuit diagram of an on-chip zero crossing detector 50, having an output terminal labeled OUT, suitable for detecting the output on the sense electrodes $SE_+$ and $SE_-$ of the main CCD 10 (FIG. 2). The transistors in the amplifier 50 which have their gate regions shaded have a threshold voltage which is equal to about +1 volt (N-MOS) by reason of a suitable boron channel implant, whereas the other transistor thresholds are all equal to about 0 volt. Typically, this boron implantation is performed after the first level polysilicon metallization is laid down, so that the transistors with boron-implanted channels are thereafter supplied with second-level polysilicon gate electrodes, since the first-level polysilicon is opaque to, and masks against, the boron implantation. Typical values of the ratio of the channel width to length are indicated alongside the corresponding transistors in FIG. 5. The transistors M1 and M2 serve as input transistors for a preamplifier of the output signal on the sense lines $SE_+$ and $SE_-$. This preamplifier is provided with reset transistors M29 and M30 controlled by a sequence of applied pulsed voltages supplied by a suitable reset voltage source RS. Transistors M10, M11, M12, and M13 are connected as diodes in series in order to provide suitable control voltages to the gate electrodes of transistors M8 and M9 which, in turn, provide suitable constant current for the preamplifier. Likewise, transistors M3 and M4 are connected as diodes, serving also as loads for the preamplifier.

The cross-coupled transistors M16 and M17 form the core of a flip-flop detector of the output of the preamplifier transistors M1 and M2 as coupled thereto through the capacitors $C_1$ and $C_2$. The pulsed voltage CORL periodically turns "on" transistors M18, M19, and M20 to precharge the nodes $N_1$ and $N_2$ of this flip-flop. After the CORL pulse terminates, thereby turning "off" the transistors M18, M19, and M20, the offset output voltages of the preamplifier are stored in the capacitors $C_1$ and $C_2$. Then, a pulse of the reset latch RL turns on transistor M31, whereby the potential of one of the nodes $N_1$ and $N_2$ goes to ground and the other of these nodes goes to an intermediate voltage value. Which of these nodes thus goes to the intermediate voltage is determined by which of the sense lines, $SE_+$ and $SE_-$, has just before detected the larger charge in the CCD section 10 plus 20 (i.e., plus desired threshold). Then, the next pulse of the reset voltage RS turns "on" the transistors M23 and M24 of the output stage of the zero crossing detector 50 formed by these transistors in combination with transistors M25, M26, M27, and M28 (while at the same time this reset pulse of RS also turns "on" the transistors M29 and M30 of the preamplifier for detection of the next output of the CCD). This turning "on" of transistors M23 and M24 enables the voltage on flip-flop nodes $N_1$ and $N_2$ to control the transistors M25 and M26, that is, one of the transistors M25 or M26 is thus turned "on" depending upon which of the nodes $N_1$ or $N_2$, respectively, is at the aforementioned intermediate voltage. Thereby, also one of output transistors M28 and M27 is turned "on", respectively, as one of the transistors M25 and M26 is thus "on". Accordingly, the voltage of the output terminal OUT goes to nearly 5 volts or to voltage SS, respectively, depending upon which of these transistors M28 and M26 is "on". Thus, the resulting sequence of output voltages of the amplifier 50, in response to the pulse sequence of RS, represents the corresponding sequence of detections of charge by the sense lines $SE_+$ and $SE_-$, as desired.

Figure 6:
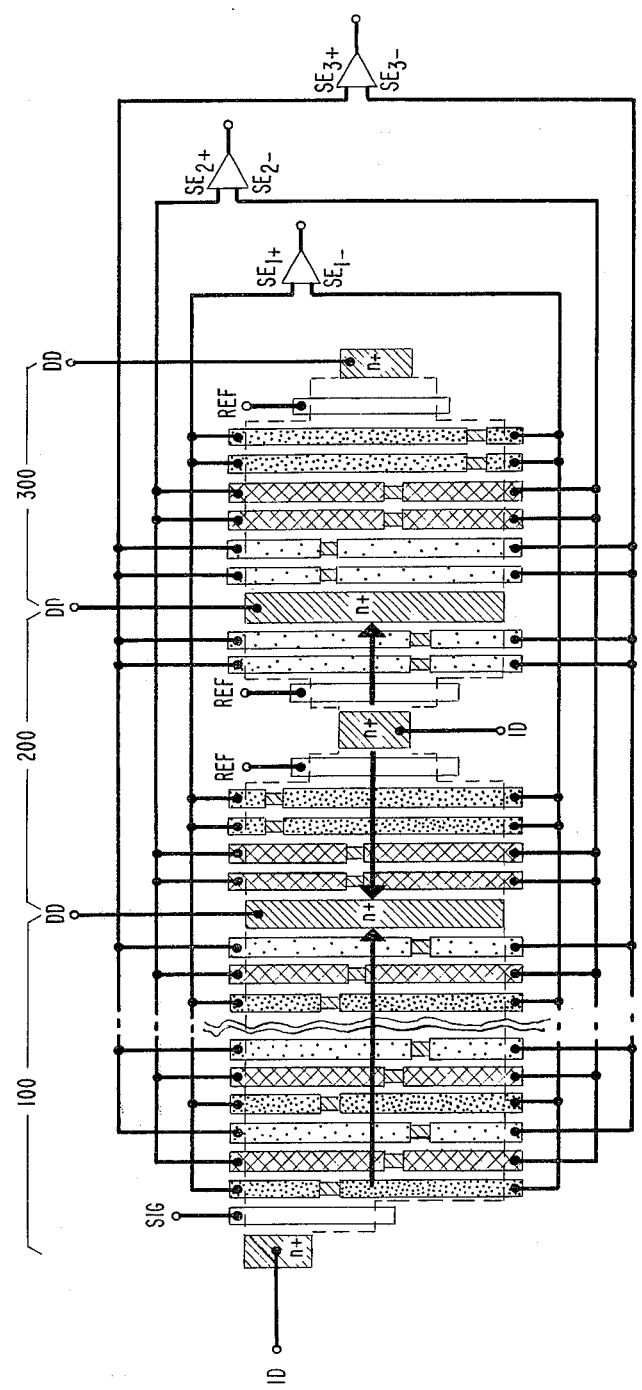
FIG. 6 is a simplified top view diagram of a CCD split-electrode triple filter apparatus with controllable threshold levels, in accordance with an alternate embodiment of the invention.

FIG. 6 is a top-view diagram of a CCD split-electrode triple filter with controllable threshold levels, that is, having three separate outputs corresponding to three different sets of sense electrode pair lines ($SE_{1+}$, $SE_{1-}$), ($SE_{2+}$, $SE_{2-}$) and ($SE_{3+}$, $SE_{3-}$). This filter has a main section 100, an auxiliary section 200, and an added "dummy" section 300, having similar respective functions as the CCD sections 10, 20, and 30 of FIG. 2, except that now there is the added capability of selectively filtering three different frequency characteristics of the signal, such as for example, a human voice passband plus two other desired passbands. This capability of multiple filtering is similar to that described in the aforementioned paper of A. A. Ibrahim et al.

Figure 7:
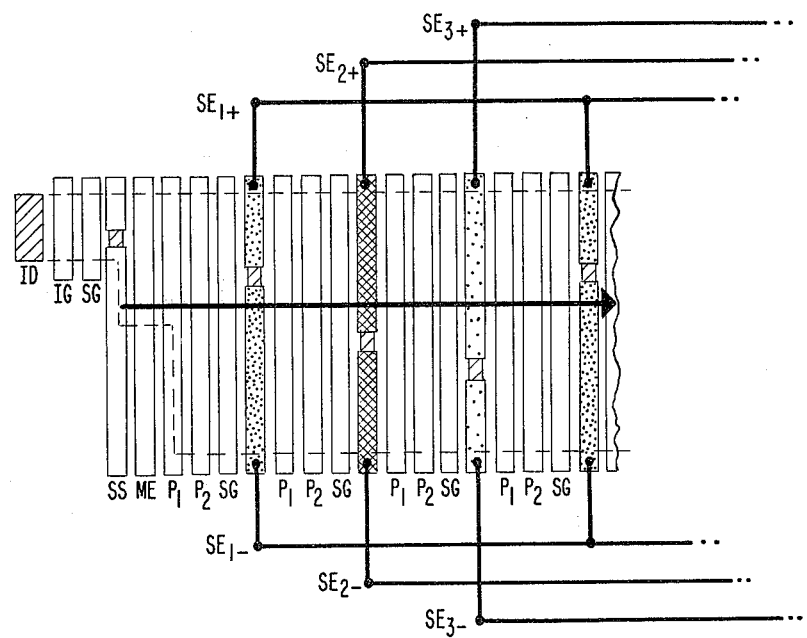
FIG. 7 is a top view diagram of the apparatus shown in FIG. 6, indicating the electrode configuration in greater detail.

Whereas, for the sake of simplicity and ease of understanding, only the REF and SIG electrodes, and the sense electrode pairs, are illustrated in FIG. 6, it should be understood that between each successive sense electrode pair there are three electrodes, one each of the type $P_1$, $P_2$, and SG. The details of this arrangement are indicated in FIG. 7, which shows the left-hand (input) end of the main section 100 in greater detail than does FIG. 6.

The auxiliary section 200 controls the threshold levels of the three filters. As further indicated by the arrows in FIG. 6, charge packets in this auxiliary section 200 which control the thresholds of the sense electrode pair lines ($SE_{1+}$, $SE_{1-}$) and ($SE_{2+}$, $SE_{2-}$) flow from right to left, while charge packets which flow from left to right control the threshold of the sense electrode pair lines ($SE_{3+}$, $SE_3$). This arrangement of bidirectional charge flow in the auxiliary section 200 enables greater compactness of construction, by avoiding the need for two side-by-side n+ regions (201 and 301 in FIG. 2). It should be noted that the locations of the gaps in the sense electrode pairs of the added "dummy" section 300 are mirror images of the splits in the sense electrodes of the auxiliary section 200, that is, located complementarily on respective opposite sides of the center of the channel at the same distances therefrom. For the sake of greater threshold shift capability, there are two threshold shifting sense electrode pairs on each line in the auxiliary CCD 200, but is should be understood that, for smaller threshold shifts only, one such sense electrode pair per line is needed, and that, for larger threshold shifts, three or more such sense electrode pairs per line can be used.

Although the invention has been described in terms of specific embodiments, various modifications can be made without departing from the scope of the invention. For example, instead of two separate external contacts for the shield gate line, a single such contact can be made for the upper SG line with a "jumper" metallization bridging across the region between the auxiliary and the added "dummy" sections of the CCD. Moreover, although the drawing indicates that $P_1$ electrode 106 and $P_2$ electrode 127 serve as "jumper" connections for the upper and lower respective $P_1$ and $P_2$ lines, other arrangements for interconnecting these lines can be used including separate external connections. Also, separate control over the different thresholds in a multiple filter can be achieved by using different sized auxiliary charge packets for the different filters in separate auxiliary channels for each of the filters. In addition, input for the auxiliary CCD can be in the form of multiple individual input diodes located for feeding different transverse portions of the auxiliary channel with different charges, each such diode controlled by a separate external voltage pulse, thus affording flexibility of control over the threshold as a function of time. Finally, n- and p-type conductivity can be interchanged everywhere, for a device in P-MOS technology.

I claim:

1. Semiconductor apparatus comprising:
    a semiconductor charge coupled device having at least one array of split-electrodes, each split-electrode spanning across an underlying signal charge transfer channel of width W in a semiconductor medium arranged for transfer of signal charge packets through N transfer stages in a first transfer direction along said channel into a charge sink, and each split-electrode having a first segment (A) connected to a first common output terminal and a second segment (B) connected to a second common output terminal, thereby forming a first CCD section (10 or 100), CHARACTERIZED IN THAT said device includes an auxiliary charge transfer channel in said medium arranged for transfer of predetermined auxiliary charge packets, all of the same charge content, through n transfer stages in a second transfer direction N being at least an order of magnitude larger than n, at least one auxiliary split-electrode spanning the said auxiliary transfer channel and having first and second segments connected, respectively, to the said first and second common output terminals thereby forming a second CCD section (20 or 200), whereby the threshold level for signal detection by the first section is controlled by the second section.

2. Semiconductor apparatus according to claim 1 FURTHER CHARACTERIZED IN THAT said auxiliary channel is of the said width W.

3. Semiconductor apparatus according to claim 1 in which the second direction is opposite to the first direction.

4. Semiconductor apparatus comprising:
    (a) a first semiconductor charge coupled device section having an array of N split-electrodes of at least two segments per electrode for sensing charge packets being transferred in a first channel in said first section in a first direction in a monocrystalline semiconductive medium,
    (b) a second semiconductor charge coupled device section having one or more (n) split-electrodes each of at least two segments for sensing predetermined charge packets all of equal charge content being transferred in said second section in a second channel in a second direction in said medium, N being at least an order of magnitude larger than n, a first segment of said one split-electrode being conductively coupled to a first common output terminal to which is conductively coupled a first segment of every split-electrode of said array, and a second segment of said one split-electrode being conductively coupled to a second common output terminal to which is conductively coupled a second, different segment of every split-electrode of said array.

5. Semiconductor apparatus in accordance with claim 4 which further includes a third split-electrode device section having a third channel portion of the same width W as that of the second channel characterized in that each split-electrode of the third section is split at a location complementary to that of a corresponding split-electrode in the second section, each segment of said split-electrode of the second section being connected to the same sense line as the corresponding segment of the corresponding split-electrode of the third section.

6. Semiconductor apparatus according to claim 5 in which the first and second sections have charge packet transfer channels of the same width W.

7. Semiconductor apparatus according to claim 5 in which the first, second, and third sections contain channels of the same width W defined by an overlying relatively thin oxide layer on a major surface of the semiconductor.

8. Semiconductor apparatus according to claim 4 in which the first and second sections have charge packet transfer channels of the same width W.

9. A semiconductor device comprising:
    (a) a body of semiconductor material including first and second channel portions, overlaid by a relatively thin layer of insulating material, arranged for the propagation of signal dependent charge packets of charge content along said first channel portion in accordance with a signal and of signal independent charge packets of mutually equal charge content along said second channel portion;
    (b) an array of N split-electrodes insulatingly overlying said first channel portion, each said split-electrode having a first segment and a second segment with a gap therebetween;
    (c) a split-electrode of first and second segments with a gap therebetween insulatingly overlying said second channel portion, the first segment of said split-electrode overlying the second channel portion connected to all the first segments of the split-electrodes overlying the first channel portion, and the second segment of said split-electrode overlying the second channel portion connected to all the second segments of the split-electrodes overlying the first channel portion, said first and second channel portions having the same width W.

10. Semiconductor apparatus according to claim 9 in which said body further includes a third channel portion of said width W overlaid by relatively thin insulating material and including a split-electrode, overlying said third channel portion, having a gap located complementarily with respect to the gap in the split-electrode overlying the second channel portion.

* * * * *

UNITED STATES PATENT AND TRADEMARK OFFICE
CERTIFICATE OF CORRECTION

PATENT NO. : 4,245,199

DATED : January 13, 1981

INVENTOR(S) : Paul I. Suciu

It is certified that error appears in the above—identified patent and that said Letters Patent is hereby corrected as shown below:

In the Abstract, lines 2 and 9, "transveral" should read --transversal--. Column 1, line 67, "$r_i/2$" should read --$r_i)/2$--. Column 7, line 21, "$SE_{30}$" should read --$SE_+$--. Column 8, line 41, "illustrate" should read --illustrates--. Column 10, line 1, "section" should read --sections--; line 54, "$SE_3)$" should read --$SE_{3-})$--. Column 12, lines 18 and 19, "characterized in that" should read --CHARACTERIZED IN THAT--.

Signed and Sealed this

Twenty-eighth Day of April 1981

[SEAL]

Attest:

RENE D. TEGTMEYER

Attesting Officer

Acting Commissioner of Patents and Trademarks